United States Patent [19]
McLean et al.

[11] Patent Number: 5,195,102
[45] Date of Patent: Mar. 16, 1993

[54] TEMPERATURE CONTROLLED LASER DIODE PACKAGE

[75] Inventors: Thomas McLean; Gregory S. Moore, both of Los Angeles County, Calif.

[73] Assignee: Litton Systems Inc., Beverly Hills, Calif.

[21] Appl. No.: 760,036

[22] Filed: Sep. 13, 1991

[51] Int. Cl.[5] ............................................. H01S 3/04
[52] U.S. Cl. ......................................... 372/34; 372/36
[58] Field of Search ................................... 372/34, 36

[56] References Cited

U.S. PATENT DOCUMENTS

| | | | |
|---|---|---|---|
| 4,338,577 | 7/1982 | Sato et al. | 372/36 |
| 4,631,728 | 12/1986 | Simons | 372/34 |
| 4,689,659 | 8/1987 | Watanabe | 372/34 |
| 4,727,554 | 2/1988 | Watanabe | 372/34 |
| 4,792,957 | 12/1988 | Kollanyi | 372/36 |
| 4,803,689 | 2/1989 | Shibanuma | 372/36 |
| 5,005,178 | 4/1991 | Kluitmans et al. | 372/36 |
| 5,031,184 | 7/1991 | Greve et al. | 372/36 |
| 5,068,865 | 11/1991 | Ohshima et al. | 372/36 |
| 5,105,429 | 4/1992 | Mundinger et al. | 372/34 |
| 5,118,964 | 6/1992 | McArdle | 372/34 |

*Primary Examiner*—Léon Scott, Jr.
*Attorney, Agent, or Firm*—James F. Kirk; Harold E. Gillmann; M. Michael Carpenter

[57] ABSTRACT

The invention temperature controlled package comprises a case having sidewalls that form a closed perimeter; a cover; and a base having an input surface and an output surface. The sidewalls are integrally coupled to the base input surface to define an interior region. A heatsink has a top surface and a bottom surface. The heatsink bottom surface is attached to the input surface of a thermoelectric cooler. The bottom surface of the thermoelectric cooler is coupled to the base input surface of the case. The thermoelectric cooler responds to a control signal to move heat from the thermoelectric cooler input surface to the thermoelectric cooler output surface. In a first alternative embodiment, a laser diode coupled to the heat sink responds to an electrical input signal to providing an optical laser output signal. The optical output of the laser diode is coupled via a optical fiber through a fiberoptic feedthrough in a sidewall. The interior region is filled with xenon gas. A cover is welded on the sidewalls to form a sealed interior region with xenon gas therein. The xenon gas limits the movement of heat from the interior surface of the sidewalls and the interior surface of the cover to the surfaces of the thermoelectric cooler.

13 Claims, 6 Drawing Sheets

TEMPERATURE CONTROLLED LASER DIODE PACKAGE

BACKGROUND OF THE INVENTION

1. Field of Invention

This invention relates to the field of packages used for packaging electronic devices such as integrated and hybrid circuits and more particularly to the field of temperature controlled packages for laser diodes, crystals, temperature stabilized networks and focal plane arrays. The field of rotation sensors such as Sagnac Effect fiber optic interferometers or FOGs (Fiber Optic Gyros) derives increased accuracy from the use of a temperature stabilized laser light source and, is therefore, a field that finds high utility for the Laser Diode Package.

2. Description of Related Art

Conventional temperature controlled packages for high power devices, such as laser diodes, are typically filled with dry nitrogen or air. The dry nitrogen or air in a temperature controlled package provides a heat path from the inner walls of the package to the device adding to the heat load that the thermoelectric cooler must accommodate in addition to the heat load that the dissipating device delivers to the heat sink.

In addition, conventional temperature controlled packages are not specifically designed to minimize the amount of heat that must be expended to obtain a given or predetermined temperature change between the case temperature and the temperature of an internal heat sink on which a dissipative device is mounted.

Typical temperature control packages that use a TEC (thermoelectric cooler) can control device internal temperatures with case temperatures ranging from −40 to +80 degrees Centigrade.

SUMMARY OF INVENTION

A first object of this temperature controlled package is to control the temperature of an internal component, such as a laser diode, as the external temperature changes from −55 to +105 degrees Centigrade, with a minimal expenditure of power.

The invention temperature-controlled package comprises a case having sidewalls that form a closed perimeter, a cover and a base having an input surface and an output surface. The sidewalls are integrally coupled to the base input surface to define an interior region.

A heatsink has a top surface and a bottom surface. The heatsink bottom surface is attached to the input surface of a thermoelectric cooler. The bottom surface of the thermoelectric cooler is coupled to the base input surface of the case. The thermoelectric cooler responds to a control signal to move heat from the thermoelectric cooler input surface to the thermoelectric cooler output surface. The thermoelectric cooler can drive heat in or out of the input surface.

A laser diode mounted on the heat sink responds to an electrical input signal by providing an optical laser output signal. The output of the laser diode is coupled via an optical fiber through a fiberoptic feedthrough in a sidewall.

The interior region is filled with xenon gas. A cover is welded on the sidewalls to form a sealed interior region with xenon gas therein. The xenon gas is inert and protects the surfaces of the laser diode and most importantly, xenon gas is a relatively poor thermal conductor and operates to limit the movement of heat from the interior surface of the sidewalls and the interior surface of the cover to the surfaces of the thermoelectric cooler. The xenon gas also limits the movement of heat between surfaces within the TEC. Reducing heat movement from these sources reduces the amount of power that the thermoelectric cooler must expend to obtain a predetermined change in temperature of the laser diode.

PREFERRED EMBODIMENT

Figure 1:
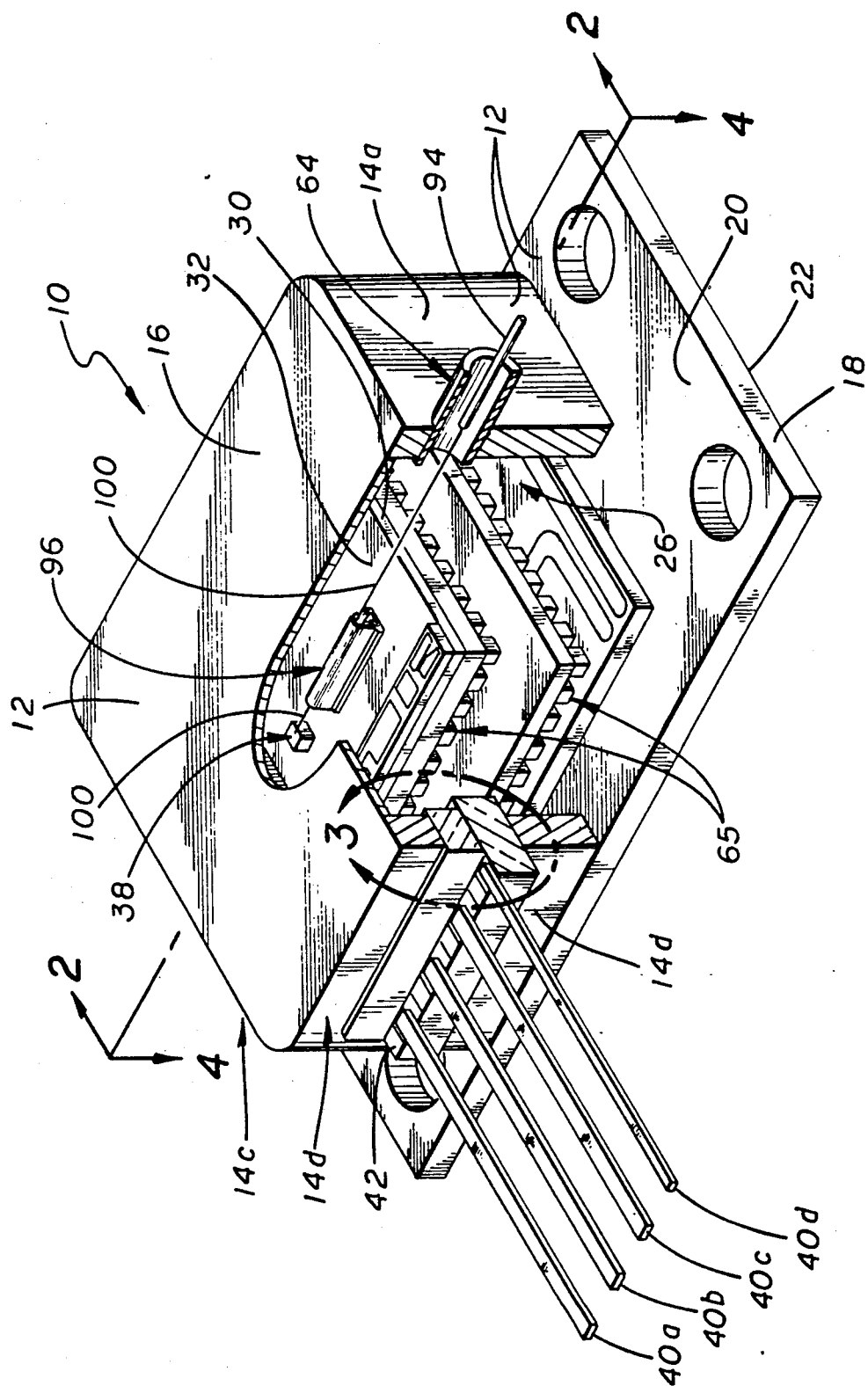
FIG. 1 is a partially sectioned perspective view of the Laser Diode Package.

FIG. 1 shows the invention temperature controlled package 10 in partially sectioned perspective view. The case 12 comprises sidewalls 14a–14d forming a closed perimeter, a cover 16 and a base 18 having an input surface 20 and an output surface 22. The sidewalls are integrally coupled to each other and to the base input surface 20 to define an interior region 26. In the example shown, the sidewalls are formed from metal by machining the required shape out of a larger piece of stock, by extrusion or by bending flat ribbon stock into the perimeter shape desired and seam welding the end edges.

Figure 2:
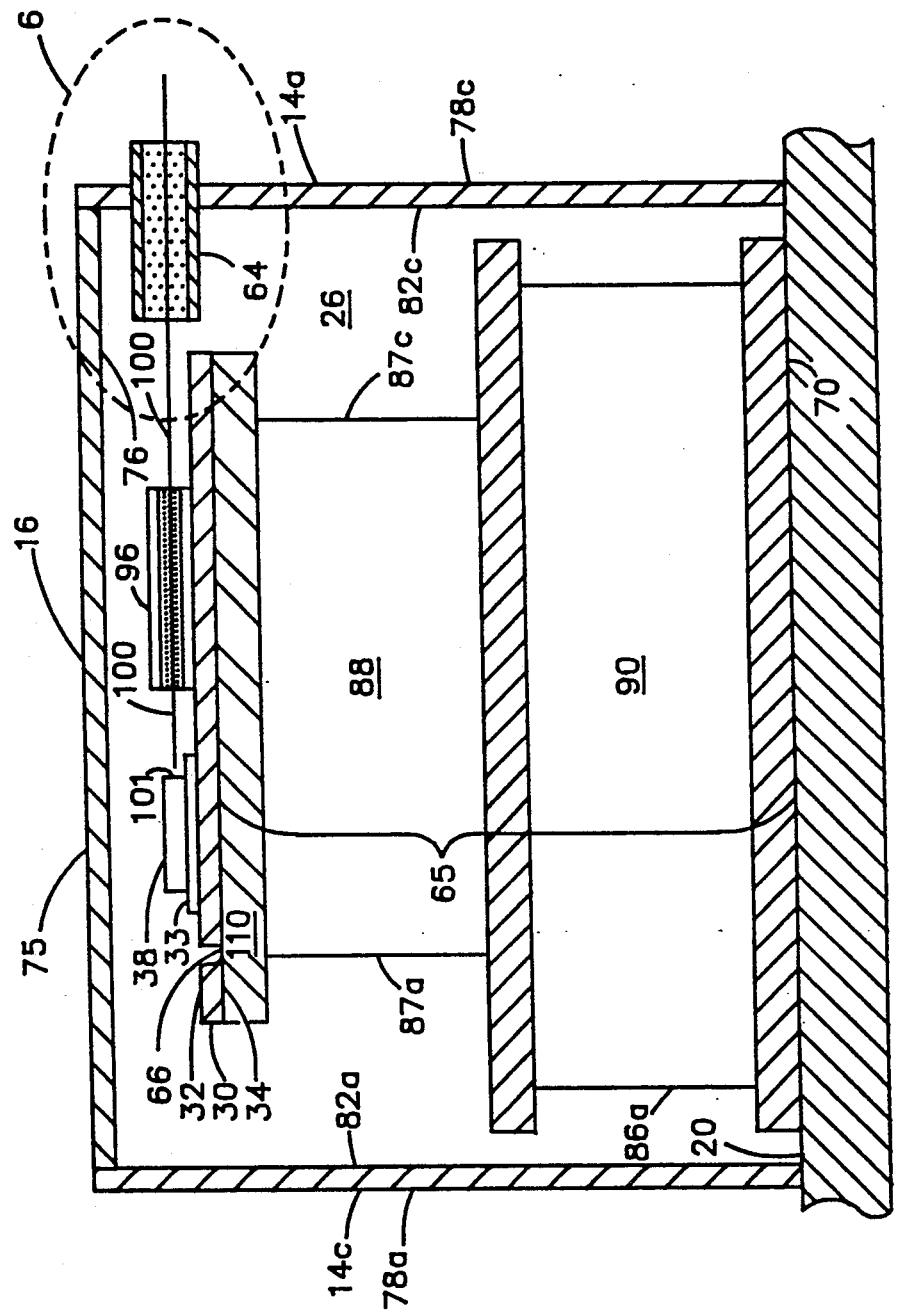
FIG. 2 is a schematic sectional view of FIG. 1 taken on line 2—2.

FIG. 2 is a schematic side sectional view taken on line 2—2 of FIG. 1 which depicts elements within interior region 26. A heatsink 30 has a top surface 32 and a bottom surface 34. Laser diode 38 represents a device means responsive to an electrical input signal for providing an optical light source. The laser diode 38 is coupled to the heatsink top surface 32. A diamond slab 33 is used as an electrical insulator and a thermal conductor. The top and bottom surface of the diamond slab 33 are metalized to be solderable. The base of diamond slab 33 is soldered to the heat sink top surface 32 and the top surface of the diamond slab is soldered to the metalized lower surface of diode 38. The four vertical sides of the diamond are not metalized. The input signal is provided from an external signal source (not shown) such as the electronic control circuitry for a FOG (Fiber Optic Gyro) via an input pin, such as input pins 40a–40d shown in FIG. 1 and FIG. 4.

Figure 3:
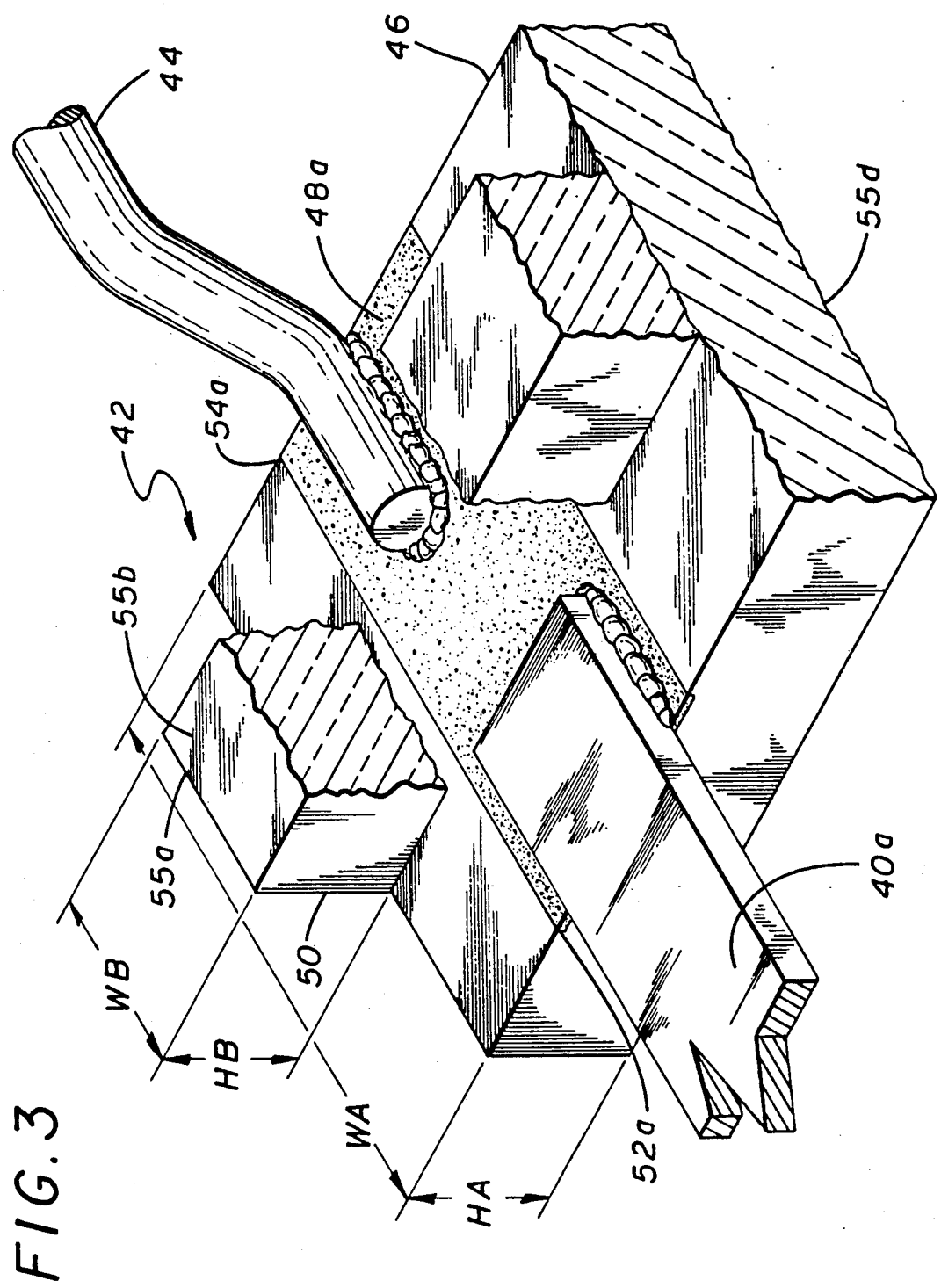
FIG. 3 is a partially sectioned perspective view of the ceramic seal within phantom circle "3" in FIG. 1.

FIG. 3 is an enlarged schematic perspective view of the area within phantom circle 3 in FIG. 1 showing an expanded and partially sectioned ceramic seal 42 of alumina or aluminum oxide, Al2O3 with a package pin 40a of gold coated Kovar having a rectangular cross section at the lower left and a compression bonded wire or flying lead 44 at the upper right. The flying lead 44 is wedge bonded to the end of the gold-coated tungsten path using a standard wedge bonding machine.

Alumina was selected for the ceramic seal 42 because the thermal expansion of Alumina or Aluminum Oxide matches the expansion of the Kovar input pins 40a and 40b . . . and Kovar Wall 14d very closely. The use of alumina for the ceramic seal offered the added advantages of increased ruggedness along with an extra low leak rate that is required to prevent normal atmospheric gases from entering the package.

Figure 4:
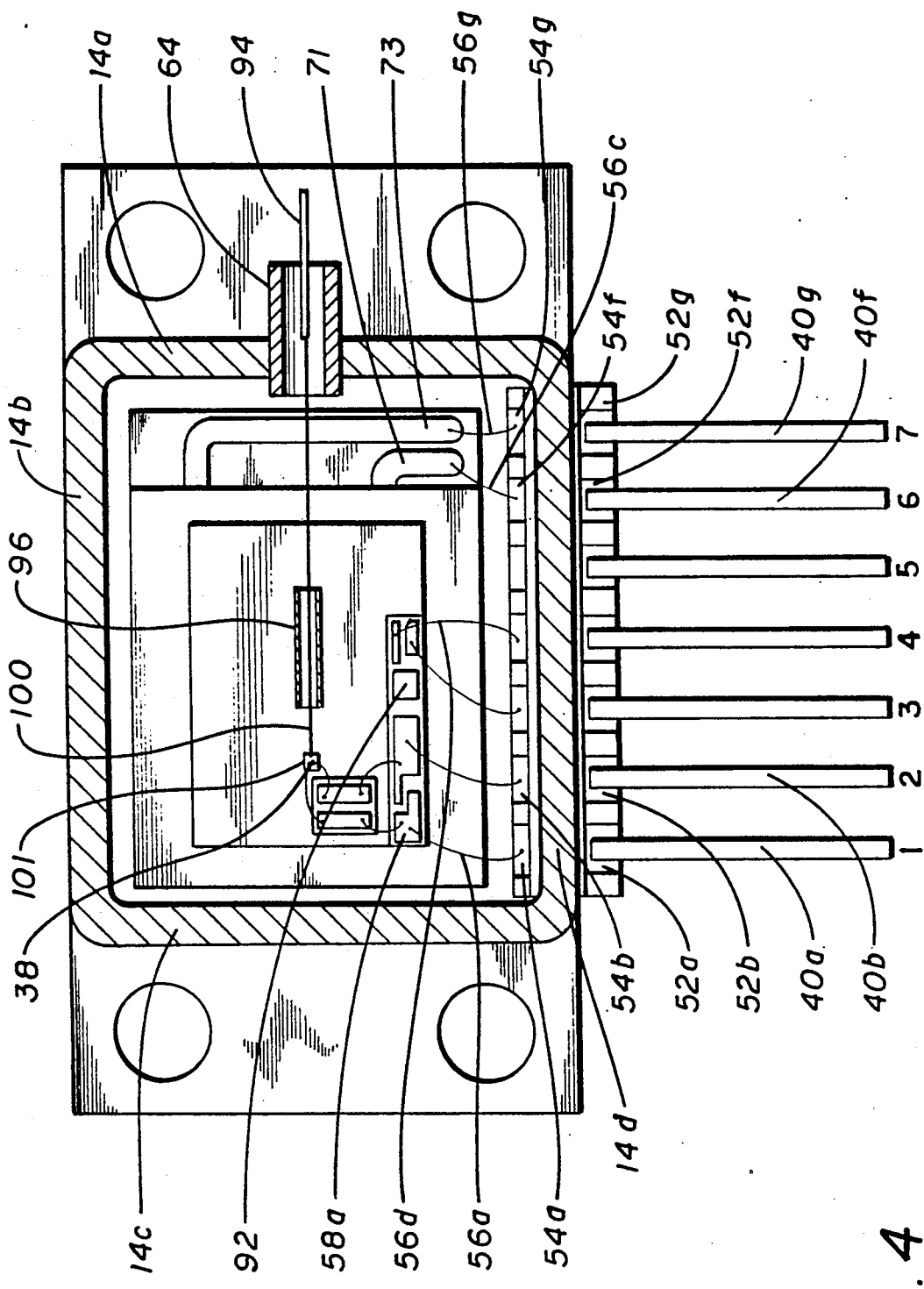
FIG. 4 is a schematic plan view of the laser diode package with the lid removed.

Referring to FIG. 4, the ceramic seal 42 of FIG. 3 is formed by depositing the required number of conductor stripes of tungsten (one for each pin) in a predetermined pattern on a first substrate 41 of alumina having a rectangular cross section with a height HA and a width WA. The first substrate 46 of alumina is then fired, in an oxygen free environment, which process drives the tungsten into the body of the alumina first substrate 46. Firing the first substrate 46 leaves the conductor path or stripe 48a of integral tungsten, imbedded within the first substrate 46. The Kovar pins 40a and 40b . . . are welded to the gold-coated tungsten external pads 52a, 52b . . .

Referring to FIG. 3, a wall 50 of alumina, having uniform height HB and thickness WB is then formed along the longitudinal axis of the substrate covering the transverse conductor stripes 48a, 48b . . . of integral tungsten. The assembled substrate with tungsten conductor stripes 48 therein and with the alumina wall 50 atop the conductor stripes 48 and running the length of the substrate is then fired to form the integral body of the ceramic seal 42 leaving exposed external pad 52a and 52b . . . and internal pads 54a, 54b . . . External surfaces 55a, 55b, 55c (not shown) and 55d are metalized to make them solderable or brazeable to the sidewall of the case 14d. Exposed external pad 52a and 52b . . . and internal pads 54a, 54b . . . are gold plated to enhance their solderability.

The ceramic seal is then inserted into a receiving aperture in the side of a sidewall 14d, as in FIG. 3. External surfaces 55a, 55b, 55c (not shown) and 55d are then soldered to the sidewall 14d. The pins 40a, 40b . . . are then welded to each of the respective external pads 52a, 52b . . .

FIG. 4, a schematic plan view of the laser diode package 10 with the lid removed, shows that conductor stripes 48a, 48b . . . 48g traverse the width of the substrate at the seven predetermined locations. Seven pins 40a, 40b . . . 40g are shown attached to respective external pads 52a, 52b . . . 52g. The seven conductor stripes enter the package and provide conductive paths to respective internal pads 54a, 54b 54g.

Two of the pins 40a, 40b are connected to a current source (not shown) to deliver drive current to the diode. Two of the leads are used to provide power to the TEC and two of the leads are used for the temperature sensor used to monitor the temperature of the diode. The remaining lead is electrically connected to the package providing a case ground.

In FIG. 4, flying lead 56a to laser diode pad 58a and flying lead 56b to laser diode pad 58b deliver diode forward current If at voltage Vf to provide an optical output signal via core and bare cladding 100 passing through optical feedthrough 64.

FIG. 2 depicts thermoelectric cooler 65 representing a thermoelectric cooler means having an input surface 66 coupled to the heatsink bottom surface 34 and a thermoelectric cooler output surface 70 coupled to the base input surface 20. The thermoelectric cooler 65 responds to a control signal received via pins 40f, 40g from a pump temperature control signal source (not shown) to external pins 40f, 40g, then to external pads 52f, 52g, to internal pads 54f, 54g and then via flying leads 56f, 56g to first and second TEC pads 71 and 73 respectively for moving heat from the thermoelectric cooler input surface 66 to the thermoelectric cooler output surface 70.

Control circuitry for controlling the temperature of the a laser diode such as laser diode 38 by delivering a control current to a TEC is shown in a U.S. patent application Ser. No. 07/585,712, filed Sep. 19, 1990 Fidric et al for "A Stabilization Apparatus and Method for an SFS" and having a common assignee, the contents of which are incorporated herein by reference.

Referring again to FIG. 2, the cover 16 is coupled to the sidewalls 14a-14d by seam welding to form the sealed interior region 26. The cover 16 has outer surface 75 and inner surface 76 and the sidewalls 14a-14d have outer surfaces 78a, 78b, . . . and inner surface 82a, 82b, . . . The thermoelectric cooler 65 with heatsink 30 and laser diode 38 thereon extends into the sealed interior region 26 and has lower TEC exposed surfaces 86a, 86b . . . and top TEC exposed surfaces 87a, 87b, 87c . . .

Xenon gas fills the sealed interior region 26 between the sidewalls 14a, 14b, . . . and the cover inner surface and the exposed surface 86a, 86b and therefore represents an insulation means for limiting the movement of heat from the sidewalls and cover inner surface to the lower TEC exposed surfaces 86a, 86b . . . , the top TEC exposed surfaces 87a, 87b, 87c . . ., the heatsink 30 and the laser diode 38. The xenon penetrates the space within all TEC internal voids. It should be understood that the TEC first stage 88 and the TEC second stage 90 are comprised of a large number of vertical arrays of Bismuth Telluride columns that extend between the Beryllium Oxide plates thereby exposing a large total internal surface area that remains in thermal contact with the fill gas within the voids and which is also in contact with the inner sidewalls of the case. The gas acts within the voids as a poor conductor of heat from the cover inner surface 76, the sidewalls 14a, 14b . . . to the TEC exposed surfaces 86a, 86b, . . . , 87a, 87b, 87c . . . and from other internal TEC surfaces. The xenon gas therefore acts as a thermal insulator and reduces the amount of power required by the thermoelectric cooler via its input control signal to obtain a predetermined change in the temperature of the laser diode 38. Xenon has the poorest thermal conductivity of all inert gases in Group VIII that is a non-radioactive inert gas.

Figure 6:
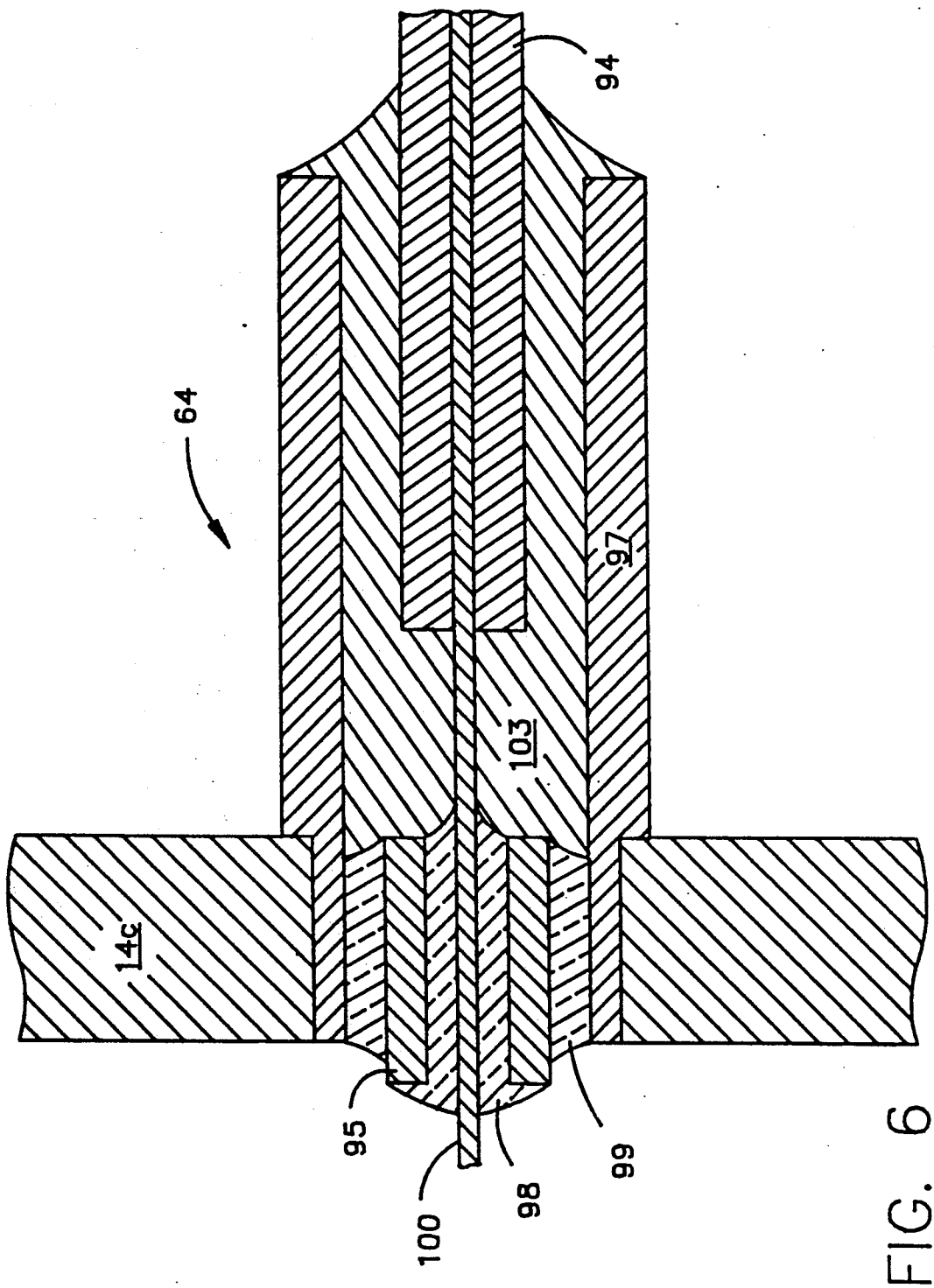
FIG. 6 is an expanded sectional view of the feedthrough shown within phantom circle "6" in FIG. 2.

In an alternative embodiment, the invention temperature controlled package 10 is used to control the temperature of device means such as an integrated optic device. FIG. 6 is an expanded sectional view of feedthrough 64 in FIG. 4 taken through the fiber 94. In such an alternative embodiment, the case wall 14c has an optical receiving port such as feedthrough 64 that is responsive to a light ray from a external light source (not shown). The optical receiving port receives light from an external source and couples that light into the package. The function of an optical receiving port is provided by a first optical feedthrough 64, and a first pigtail fiber 94 passing through the feedthrough 64. The first pigtail fiber 94 is positioned to receive light from an external light source and couple the light into the case interior region 26.

The bare cladding 100 is metalized for solderability and is soldered to inner tube 95 using a first solder 98 in a first soldering step in fabricating the optical feedthrough 64. Inner tube 95 is then soldered to outer tube 97 using second solder 99. The pigtail fiber 94 penetrates outer tube 97 and is attached to the inner wall of outer tube 97 using epoxy 103 to provide strain relief for bare cladding 100 as it exits the first solder 98.

In such an embodiment, an integrated optic device is coupled to receive the light from the pigtail. A typical integrated optic device has an electrical input responsive to an electrical control signal for modulating the light ray and for outputting a modulated light ray.

Such an alternative embodiment also has a second optical feedthrough (not shown) similar to that shown in FIG. 6, and a second pigtail fiber passing therethrough. The second pigtail fiber is positioned to receive the modulated light ray and couples the modulated light ray outside of the case.

In yet another alternative embodiment, the case has an optical receiving port that has a lens. The lens is positioned to focus an image on a focal plane. The focal plane comprises an array of photosensitive detectors that form the focal plane and which are responsive to the image. The optical image is focused on the focal plane array, and the device means is characterized to provide an output signal characterizing the focused image focused on the focal plane array. The output signal is an electrical signal characterizing the grey scale of pixels that comprise the focused image.

The embodiment of FIGS. 1, 2, and 4 show a two stage TEC (thermoelectric cooler) having a first stage TEC 88 and a second stage TEC 90. Each respective stage is mechanically coupled in tandem, one on top of the next. Each respective thermoelectric cooler is responsive to a respective control signal via pins 40f and 40g as described above. Each respective TEC is driven in series, both electrically and thermally, by the control signal.

The embodiment of FIGS. 1 and 2 is improved by the addition of a thermistor 92 shown in FIG. 4 or other temperature sensing sensor functioning as a temperature sensing means responsive to the temperature of the heatsink 30 for providing a temperature control signal via flying leads 56c and 56d scaled to indicate the temperature of the heatsink 30 to an external control circuit.

The control circuitry (not shown) is used for controlling the temperature of the a laser diode, such as laser diode, 38 shown in a U.S. Pat. No. 5,136,600, filed Sep. 19, 1990, issued Aug. 4, 1992 by Fidric et al for "A Stabilization Apparatus and Method for an SFS", and assigned to a common assignee; the contents of which are incorporated herein by reference. The "600" patent shows the use of a temperature sensing means, such as a thermistor, the thermistor being responsive to the temperature of the heatsink 30 for providing a temperature signal scaled to indicate the temperature of the heatsink 30 to a control circuit.

The control circuit (not shown) is connected to the thermistor 92 to respond to the temperature signal from the thermistor and to an input reference signal, as shown in the "600" patent, for comparing the temperature signal with the input reference signal and for amplifying the difference to provide an amplified error signal to a modulator or power amplifier to provide the control signal to the TEC for adjusting the thermoelectric control signal to pins 40f and 40g to drive the difference signal to zero.

FIG. 4 shows pigtail fiber 94 coupled to laser diode 38. Pigtail fiber 94 passes through holder 96. Pigtail fiber 94 is stripped to provide a bare core and cladding 100 that is lensed and coupled to the output of laser diode 38 at laser facet 101. Holder 96 provides a means for holding the bare core 100 while the bare core face (not shown) at laser facet 101 is aligned with the output surface of the laser diode 38. The pigtail fiber 94 extends out through optical feedthrough 64. The pigtail fiber 94 is immobilized in the optical feedthrough 64 and in the holder 96 by solder. A small gap is provided between the end of the fiber and the laser diode. The cladding or outer surface of the pigtail 100 is coated to enhance solderability during assembly. The combination of the pigtail fiber 94, the holder 96 and the optical feedthrough 64 represent a means for coupling the laser output signal to an optic fiber exiting the case.

OPERATIONAL AND MANUFACTURING CONSIDERATIONS

Referring again to FIG. 2, in operation, the laser diode package 10, in typical avionics applications, is subjected to a wide range of environmental temperatures that range from arctic to desert conditions. The most difficult control condition for the package 10 occurs when the package is exposed to a high-end temperature.

By way of example, if the package is 100 degrees Centigrade and the device inside must be cooled to 30° C., the TEC cooler 88, 90 has to sink enough heat from the laser diode 38 to take the part down 70 degrees. The cooler must also sink heat reaching the external surfaces of the TEC 86a, 86b, . . . and the external surfaces of heatsink 30 via radiation from the walls 82a, 82b . . . in the package and heat that is conducted from the base and walls of the package via the gas within the package. If the package is filled with a gas that has a high thermal conductivity, the thermal loads can be so high that the laser diode or other device on the heatsink 30 in the package will not be cooled down enough.

The use of a vacuum was considered but proved to be difficult to implement. The assembly of a laser diode 38, or other complex device such a focal plane array, into a temperature control package requires numerous steps that include attaching the device onto the diode submount surface or heatsink 30, attaching electrical leads from internal package pads to the TEC cooler pads and to the laser diode and aligning and attaching the fiber optic lead through the package wall to the laser diode. The laser diode is then sealed, while the package is in a glove box or chamber, using a seam welder.

Use of a vacuum would require the development of a procedure and equipment not commonly available at vendors who would typically be asked to make the part. Filling the case of the part with a gas such as Xenon in a glove box while using a seam welder to attach the final lid is a process that is readily available at most suppliers. The production cost of the completed package with a high power laser diode installed therein is reduced as a result of the use of a gas instead of a vacuum.

As explained above, Xenon was found to be the best alternative to a vacuum. Xenon has the added advantage of being an inert gas so it will not attack the facets of a laser diode or other chemically sensitive surface. Xenon is a gas with the poorest thermal conductivity of any gas that is not radioactive. Use of Xenon was found to be the only gas that made it possible to meet the requirement of operating over the wide temperature range required for military applications.

The TEC is attached to the base using In/Sn in 52:48 indium tin solder. After assembly, the temperature controlled package is baked out with the lid off. The part is then moved to an ante chamber. The chamber is pumped down twice with Xe filling each time. Xenon is heavier than air and can be poured as a gas from one open container to another. The pressure used in the chamber prior to lid seal is not sufficient to cause deformation of the package surfaces after the package is removed from the slightly pressurized chamber.

The laser diode used in the package provides a large amount of optical power, i.e. . . . typically more than 100 Mw. The laser diode typically dissipates approximately 850 milliwatts in the application shown. The diode Vf is 1.7V–1.9 V. The diode current is slightly in excess of 400 Ma.

Using a TEC cooler, by Marlow of Dallas, Tex. having a model number MI2012, with an laser diode dissipating 800 Mw, the package temperature being 105° C., the TEC required 5.4 W of power to hold the laser diode temperature at 30° C. with a package filled with nitrogen. With the package at 105° C. and with the package filled with Xenon, the TEC only required 4.2 W to hold the laser diode at the same temperature for an estimated power saving of 1.2 Watts. This power saving is substantial in an aerospace application, such as an inertial guidance system, with a limited power budget.

In the embodiment of FIGS. 1 and 2, the MI2012 TEC 65 is a two stage cooler with the approximate dimensions of 0.515×0.389×0.149 inches. The TEC had three plates that were 0.025 in. thick. The top plate or heatsink 30 on which the laser diode was mounted measured approximately 0.346×0.260×0.024 inches. The heatsink 30 is made of nickel iron. The heatsink 30 is coupled to top TEC ceramic plate 110. The top TEC ceramic plate 110 is made of BeO. The TEC ceramic plate 110 has a top surface 114 and a bottom surface 116. The floor of the package is called the base reference or base input surface 20.

As shown in FIG. 2, the TEC 65 operates between the thermoelectric input surface 66 and base input surface 20. The two stage TEC has three plates. All three plates are made of BeO. The elements between the plates are made of $Bi_2Te_3$, or Bismuth Telluride. The TEC first stage is positioned above the TEC second stage 90. Two wires connect and enter the bottom stage. The Bismuth Telluride used for the top and bottom units is then attached to the respective center or bottom surface using solder having a high melting point. The metal package is supplied by Kyocera of Tokyo, Japan.

Figure 5:
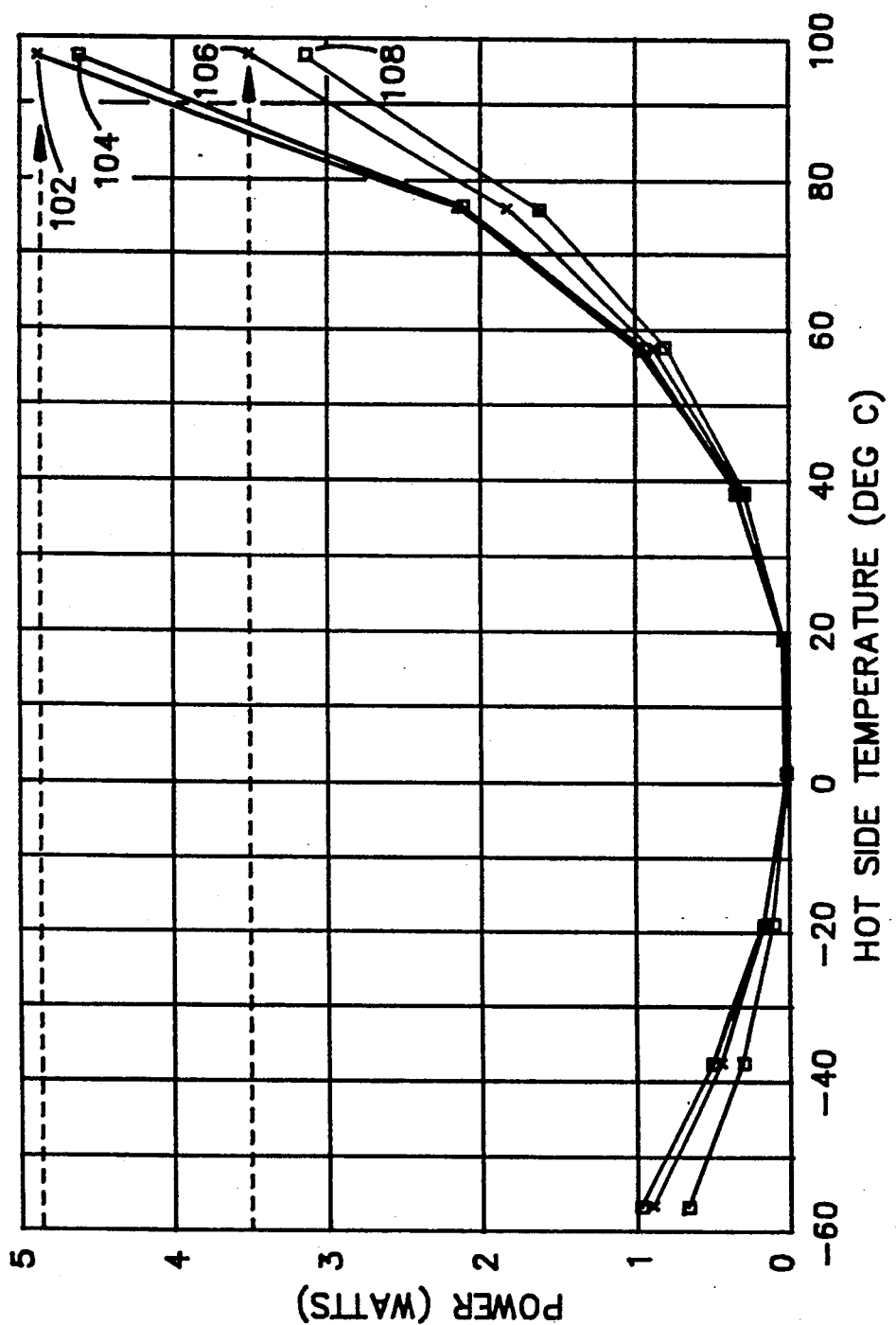
FIG. 5 is a graph of the temperature-controlled package TEC power consumption as a function of case hot side temperature for a case filled with air and for a case filled with Xenon showing predicted and measured values for each.

FIG. 5 is a graph of the temperature controlled package TEC power consumption as a function of case hot side temperature for a case filled with Xenon and for a case filled with air showing predicted and measured values for each. The first curve 102 at the top, shows the measured TEC power for a case filled with air. The second curve 104 tracks the first curve closely and shows the calculated TEC power for a case filled with air. The third curve 106 is below the second curve 104 and shows the measured TEC power for a case filled with Xenon. The fourth curve 108 appears at the bottom and shows the calculated TEC power for a case filled with Xenon.

The above-described embodiments are furnished as illustrative of the principles of the invention, and are not intended to define the only embodiment possible in accordance with our teaching. Rather, the invention is to be considered as encompassing not only the specific embodiments shown, but also any others falling within the scope of the following claims.

We claim:

1. A temperature controlled package for enclosing at least one component operating at a temperature, said temperature controlled package being coupled to receive an input signal from an external input signal source and to receive a thermoelectric control signal from an external thermoelectric control signal source, said temperature controlled package comprising:

a case having sidewalls characterizing a closed perimeter, a cover and a base having an input surface and an output surface, the sidewalls being integrally coupled to the base input surface to define an interior region;

a heatsink having a top surface and a bottom surface;

at least one component coupled to the heatsink top surface, said component dissipating power into said heatsink top surface in response to the input signal to provide an output signal;

a thermoelectric cooler means having an input surface coupled to the heatsink bottom surface and an output surface coupled to the base input surfaced, the control signal delivering an amount of power to the thermoelectric cooler means for moving heat from the thermoelectric cooler input surface to the thermoelectric cooler output surface, the cover being coupled to the sidewalls to form a sealed interior region, the cover and sidewalls having an outer and inner surface; the thermoelectric cooler means with heatsink and component thereon extending into the sealed interior region and having a plurality of exposed surfaces;

heat moving from the cover and sidewalls inner surface to the exposed surfaces in response to a temperature gradient between the cover and sidewalls inner surface and the exposed surfaces;

insulation gas means filling the sealed interior region between the sidewall and cover inner surface and the exposed surfaces for limiting the movement of heat from the sidewalls and cover inner surface to the exposed surfaces of the thermoelectric cooler means with heatsink and component thereon extending into the sealed interior region;

whereby the amount of power expended by the thermoelectric cooler control signal in driving the thermoelectric cooler to obtain a change in the temperature of the component is reduced.

2. The temperature controlled package of claim 1 wherein the component coupled to the heatsink top surface and responsive to an input signal for providing an output signal further comprises:

a laser diode, said input signal being an electrical signal and said output signal being a laser light source;

and wherein said case means further comprises:

an optical feed-through, and a pigtail fiber passing therethrough; said pigtail fiber being positioned to receive light from said laser light source and to couple said light outside of said case.

3. The temperature controlled package of claim 1 wherein the component coupled to the heatsink top surface and responsive to an input signal for providing an output signal further comprises:

an optical receiving port responsive to a light ray from a external light source, said optical receiving port further comprising:

a first optical feed-through, and a first pigtail fiber passing therethrough; said first pigtail fiber being positioned to receive light from an external light source and couple said light into said case interior;

an integrated optic device coupled to receive said light from said pigtail and having an electrical input responsive to an electrical control signal for modulating the light ray and for outputting a modulated light ray, and;

a second optical feedthrough, and a second pigtail fiber passing therethrough; said second pigtail fiber being positioned to receive said modulated light ray and for coupling said modulated light ray outside of the case.

4. The temperature controlled package of claim 1 wherein the component coupled to the heatsink top surface and responsive to an input signal for providing an output signal further comprises:

an optical receiving port having a lens, said lens being positioned to focus an image on a focal plane;

a focal plane array of photosensitive detectors forming said focal plane and being responsive to said image, said optical image being focused on said focal plane array, said component providing an output signal for each respective detector in the focal plane array.

5. The temperature controlled package of claim 1 wherein the thermoelectric cooler means further comprise:

a first and second stage thermoelectric cooler, each respective stage being mechanically coupled in tandem; each respective thermoelectric cooler being electrically connected in series, the series connected first and second stage being electrically driven by the thermoelectric control signal.

6. The temperature controlled package of claim 1 wherein the thermoelectric cooler means further comprises:

a first- and second-stage thermoelectric cooler, each respective stage being mechanically coupled in tandem; each respective thermoelectric cooler being electrically connected in series, the first- and second-stage thermoelectric coolers being electrically connected to the thermoelectric control signal, and a temperature sensing means mechanically connected to the heatsink for providing a temperature signal scaled to indicate the temperature of the heatsink.

7. The temperature controlled package of claim 6 further comprising:

means for coupling said laser output signal to an optic fiber exiting said case.

8. The temperature controlled package of claim 1 wherein the thermoelectric cooler means further comprises:

a first and second stage thermoelectric cooler, each respective stage being mechanically coupled in series and electrically connected in series; the control signal being connected to drive the first and second stages in series;

a temperature sensing means mechanically coupled to sense the temperature of the heatsink for providing a temperature signal scaled to indicate the temperature of the heatsink;

control circuit means electrically connected to receive the temperature signal and an input reference signal for comparing the temperature signal with the input reference signal and for amplifying the difference to provide an amplified error signal; and, modulator means electrically coupled to receive the amplified error signal for adjusting the thermoelectric control signal to drive the difference signal to zero.

9. The temperature controlled package of claim 1 wherein the insulation gas means filling the sealed interior region between the sidewall and cover inner surface and the exposed surfaces for limiting the movement of heat from the sidewalls and cover inner surface to the exposed surfaces further comprises:

a non-radioactive inert gas.

10. The temperature controlled package of claim 9 wherein the non-radio active gas is xenon gas.

11. The temperature controlled package of claim 1 wherein the insulation gas means filling the sealed interior region between the sidewall and cover inner surface and the exposed surfaces for limiting the movement of heat from the sidewalls and cover inner surface to the exposed surfaces further comprises: xenon gas.

12. A temperature controlled package for enclosing at least one component operating at a substantially fixed temperature, said temperature controlled package comprising:

a case having sidewalls characterizing a closed perimeter, a cover and a base having an input surface and an output surface, the sidewalls being integrally coupled to the base input surface to define an interior region;

a heatsink having a top surface and a bottom surface;

a laser diode connected to receive an input signal for providing a laser output signal;

means for coupling said laser output signal to an optic fiber exiting said case;

a thermoelectric cooler means having an input surface coupled to said heatsink bottom surface and an output surface coupled to said base input surface, a control signal delivering an amount of power to the thermoelectric cooler means for moving heat from the thermoelectric cooler input surface to the thermoelectric cooler output surface, said cover being coupled to the said sidewalls to form a sealed interior region, the cover and sidewalls having an outer and inner surface; the thermoelectric cooler means with heatsink and the component thereon extending into the sealed interior region and having a plurality of exposed surfaces;

heat moving from the cover and sidewalls inner surface to the exposed surfaces in response to a temperature gradient between the cover and sidewalls inner surface and the exposed surfaces;

xenon gas filling the sealed interior region between the sidewall and cover inner surface and the exposed surfaces for limiting the movement of heat from the sidewalls and cover inner surface to the exposed surfaces;

whereby the amount of power required from the thermoelectric cooler control signal by the thermoelectric cooler to obtain a change in the temperature of the component is reduced.

13. A temperature controlled for enclosing at least one component requiring a substantially fixed temperature, said temperature controlled package comprising:

a sealed case having an interior region;

at least one component coupled to receive an input signal for providing an output signal;

a thermoelectric cooler means within said interior region having an input surface coupled to the device means, a thermoelectric control signal delivering an amount of power to the thermoelectric cooler means for moving heat from the thermoelectric cooler input surface to a thermoelectric cooler output surface;
the output surface being coupled to said case;
Xenon gas filling the sealed interior region;
whereby the amount of power required from the thermoelectric cooler control signal by the thermoelectric cooler to obtain a change in the temperature of the component is reduced.

* * * * *